(12) United States Patent
Hetzler et al.

(10) Patent No.: US 8,572,443 B2
(45) Date of Patent: Oct. 29, 2013

(54) SYSTEM, METHOD, AND COMPUTER PROGRAM PRODUCT FOR DETERMINING A RETENTION BEHAVIOR FOR AT LEAST ONE BLOCK OF A MEMORY DEVICE HAVING FINITE ENDURANCE AND/OR RETENTION

(75) Inventors: Steven Robert Hetzler, Los Altos, CA (US); William John Kabelac, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 692 days.

(21) Appl. No.: 12/420,589

(22) Filed: Apr. 8, 2009

(65) Prior Publication Data

US 2010/0262875 A1 Oct. 14, 2010

(51) Int. Cl.
G06F 12/02 (2006.01)
G06F 11/263 (2006.01)
G11C 29/00 (2006.01)

(52) U.S. Cl.
USPC .............. 714/719; 711/156; 365/185.09

(58) Field of Classification Search
USPC ......... 714/2, 701, 702, 719, 718, 819, 51, 46, 714/47.1, 48, 799, 31, 25, 6.2, 42, 54; 365/201, 185.33, 189.011, 230.03, 365/200, 185.09, 185.22; 711/103, 170, 711/124, 156
See application file for complete search history.

(56) References Cited

U.S. PATENT DOCUMENTS

| | | | |
|---|---|---|---|
| 4,612,640 A * | 9/1986 | Mehrotra et al. | 714/766 |
| 5,956,473 A | 9/1999 | Ma et al. | 395/182.03 |
| 6,948,098 B2 * | 9/2005 | Pillay et al. | 714/34 |
| 6,950,356 B2 * | 9/2005 | Tao | 365/201 |
| 7,173,852 B2 | 2/2007 | Gorobets et al. | 365/185.09 |
| 7,237,074 B2 | 6/2007 | Guterman et al. | 711/156 |
| 7,355,911 B2 | 4/2008 | Hartmann | 365/200 |
| 7,730,253 B2 * | 6/2010 | Fu | 711/103 |
| 8,316,173 B2 * | 11/2012 | Hetzler et al. | 711/103 |

(Continued)

OTHER PUBLICATIONS

Lee et al., "Parallelism-aware Request Scheduling for MEMS-based Storage Devices" Proceedings of the 14th IEEE International Symposium on Modeling, Analysis, and Simulation of Computer and Telecommunication Systems (MASCOTS '06); IEEE 2006.

Phalke et al., "Compression-Based Program Characterization for Improving Cache Memory Performance" IEEE Transactions on Computers, vol. 26, No. 11, Nov. 1997.

(Continued)

Primary Examiner — Phung M Chung
(74) Attorney, Agent, or Firm — Zilka-Kotab, PC

(57) ABSTRACT

A method according to one embodiment includes writing monitor data to at least one block of a memory device having finite endurance and/or retention; reading the monitor data after a period of time; determining a retention behavior of the at least one block based on the reading; and outputting a result of the determining. A memory device according to one embodiment includes a plurality of memory blocks having finite endurance and/or retention, at least one of the blocks having monitor data written therein; and circuitry for addressing the blocks. A system according to one embodiment includes a memory device having finite endurance and/or retention, the memory device comprising: a plurality of memory blocks, at least one of the blocks having monitor data written therein, wherein the at least one block has been written to a plurality of times prior to writing the monitor data; and circuitry for addressing the blocks.

25 Claims, 8 Drawing Sheets

(56) References Cited

U.S. PATENT DOCUMENTS

| | | | |
|---|---|---|---|
| 2007/0177425 A1 | 8/2007 | Gorman | 365/185.09 |
| 2008/0094891 A1 | 4/2008 | Ho et al. | 365/185.03 |
| 2008/0140918 A1* | 6/2008 | Sutardja | 711/103 |
| 2009/0138654 A1* | 5/2009 | Sutardja | 711/103 |
| 2010/0023800 A1* | 1/2010 | Harari et al. | 714/2 |
| 2010/0064096 A1* | 3/2010 | Weingarten et al. | 711/103 |
| 2010/0262795 A1* | 10/2010 | Hetzler et al. | 711/162 |

OTHER PUBLICATIONS

Ben-Aroya, Avraham, "Competitive Analysis of Flash-Memory Algorithms," Tel-Aviv University, Raymond and Beverly Sackler Faculty of Exact Sciences, School of Computer Science, Apr. 2006, pp. 1-58.

Chang et al., "Endurance Enhancement of Flash-Memory Storage Systems: An Efficient Static Wear Leveling Design," Copyright 2007 ACM, San Diego, CA, Jun. 4-8, 2007, pp. 212-217.

* cited by examiner

SYSTEM, METHOD, AND COMPUTER PROGRAM PRODUCT FOR DETERMINING A RETENTION BEHAVIOR FOR AT LEAST ONE BLOCK OF A MEMORY DEVICE HAVING FINITE ENDURANCE AND/OR RETENTION

FIELD OF THE INVENTION

The present invention relates to memory devices, and more particularly, this invention, relates to determining retention behavior in memory devices having finite endurance and/or retention.

BACKGROUND OF THE INVENTION

Some memory devices such as NAND flash memory devices possess finite write/erase endurance and/or limited data retention. Tracking the write/erase endurance and data retention is often desired to recognize a current usefulness and reliability of such memory. To date, however, proposed solutions have failed to provide acceptable solutions for these and/or other issues associated with such memory devices.

SUMMARY OF THE INVENTION

A method according to one embodiment includes writing monitor data to at least one block of a memory device having finite endurance and/or retention; reading the monitor data after a period of time; determining a retention behavior of the at least one block based on the reading; and outputting a result of the determining.

A computer program product according to one embodiment includes a computer usable medium having computer usable program code embodied therewith, the computer usable program code comprising computer usable program code configured to perform the foregoing method.

A memory device according to one embodiment includes a plurality of memory blocks having finite endurance and/or retention, at least one of the blocks having monitor data written therein; and circuitry for addressing the blocks.

A system according to yet another embodiment includes a memory device having finite endurance and/or retention, the memory device comprising: a plurality of memory blocks, at least one of the blocks having monitor data written therein, wherein the at least one block has been written to a plurality of times prior to writing the monitor data; and circuitry for addressing the blocks.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
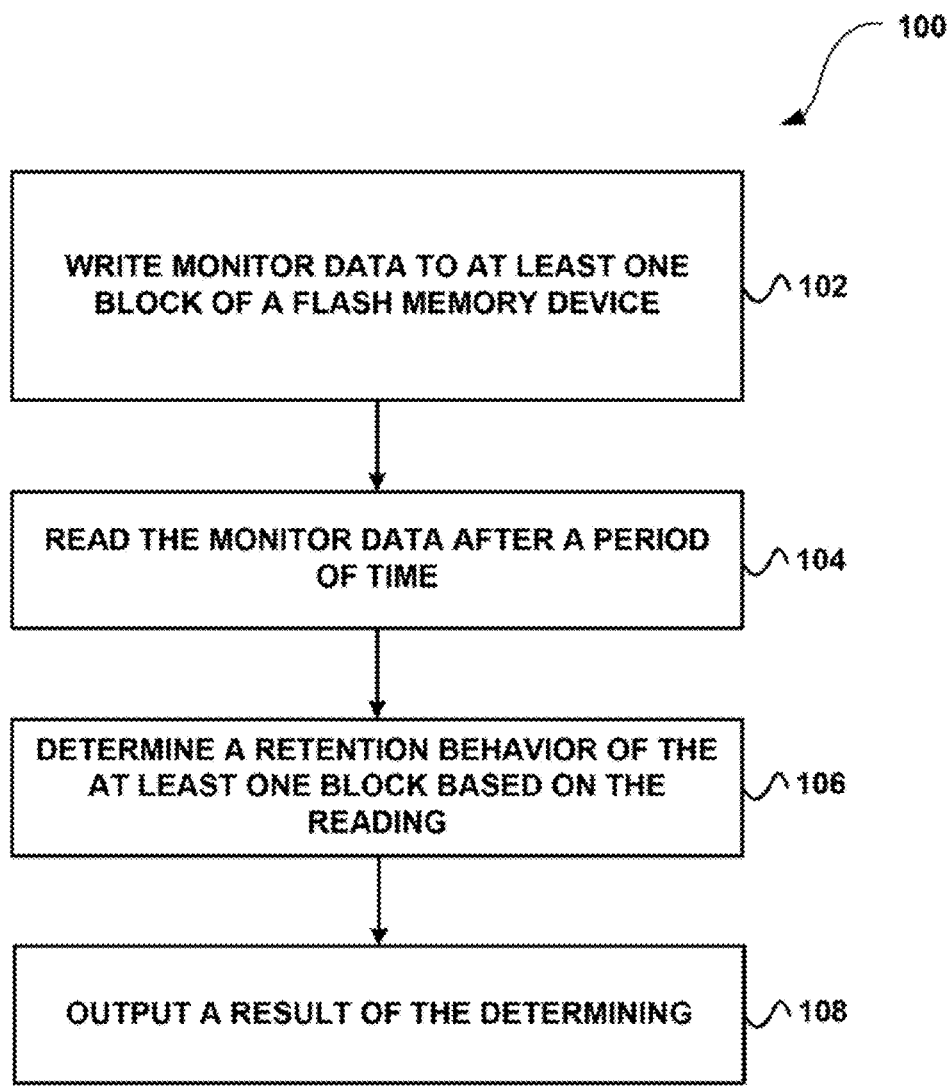
FIG. 1 illustrates a method for determining a retention behavior for at least one block of a flash memory device, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

In one general embodiment, a method is provided for determining a retention behavior for at least one block of a memory device having finite endurance and/or retention. In operation, monitor data is written to at least one block of a memory device. Additionally, the monitor data is read after a period of time. Furthermore, a retention behavior of the at least one block is determined based on the reading. Still yet, a result of the determining is output.

In another general embodiment, a computer program product is provided for determining a retention behavior for at least one block of a memory device having finite endurance and/or retention, the computer program product comprising a computer usable medium having computer usable program code embodied therewith. The computer usable program code includes computer usable program code configured to write monitor data to at least one block of a memory device having finite endurance and/or retention, computer usable program code configured to read the monitor data after a period of time, computer usable program code configured to determine a retention behavior of the at least one block based on the reading, and computer usable program code configured to output a result of the determining.

In another general embodiment, a memory device is provided, the memory device having finite endurance and/or retention and comprising a plurality of memory blocks, at least one of the blocks having monitor data written therein. The memory device further comprises circuitry for addressing the blocks.

In another general embodiment, a system is provided, the system including a memory device having finite endurance and/or retention, the memory device including a plurality of memory blocks, at least one of the blocks having monitor data written therein, wherein the at least one block has been written to a plurality of times prior to writing the monitor data. The memory device also has circuitry for addressing the blocks.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without any combination of the other features described.

The methodology and systems described herein may be implemented in conjunction with, or include, any type of memory device having finite endurance and/or retention, illustrative types of memory devices having finite write/erase endurance or limited data retention include devices comprising flash memory, phase change memory, ferroelectric memory, etc.

For ease of understanding and to place the teachings presented herein in a context, much of the present description is set forth in terms of a flash device, it being understood that this is done by way of example only and is not to be construed as limiting. Accordingly, the teachings herein may be applied to any NAND flash devices possess both finite write/erase endurance and limited data retention. Current techniques for detecting wearout and retention have escape rates that are insufficient for information technology (IT) and some consumer applications. The consequences of an escape may be severe. For example, data may be corrupted due to an escape.

The error rate in flash is a 3-D surface, as it depends both on the write cycle count and the age of the data. Since cells can be driven to complete failure, the error rate can exceed the detection power of any sector-level error correcting code (ECC). This can result in corrupt data being passed as valid on a subsequent read operation.

In some cases, NAND storage devices may implement some form of wear leveling to increase the time before the first wearout event. A side effect of such an approach is to further enhance wearout clustering, as many blocks may approach wearout at the same time. Using the sector ECC to monitor the bit error rate may suffer from an aliasing effect and the ability to detect the onset of wearout may be limited.

Some other techniques for detecting wearout are similarly lacking in accuracy. These include testing for successful erase and successful programming. These techniques cannot detect the situation where the data retention time is longer than an operation verify time of ~100 nS, but significantly shorter than the stated endurance of $3 \times 10^{17}$ nS (~10 years), which is a spread of 15 orders of magnitude. At least some embodiments provided herein address these and other limitations by providing techniques for determining a retention behavior of a flash memory device.

FIG. 1 illustrates a method 100 for determining a retention behavior for at least one block of a flash memory device, in accordance with one embodiment. As shown, monitor data is written to at least one block of a flash memory device. See operation 102.

The flash memory device may include any flash memory device including blocks of memory. For example, in one embodiment, the flash memory device may be a NAND device.

In the context of the present description, the data patterns used by the monitor data may refer to any data or data pattern that is known. For example, in one embodiment, the monitor data may include data patterns whose entire value is known to a memory system, a system including the memory, or another host system. In this case, errors may be characterized according to number, location, and pattern.

Additionally, in one embodiment, the monitor data may be generated. In this case, the monitor data may not be passed on as user data, but may be generated internally by a host system. The monitor data may be written to physical blocks, bypassing any wear leveling. In this way, the monitor data may not be subject to wear leveling.

Furthermore, multiple blocks of the flash memory device may be selected for storing the monitor data, where at least two of the blocks are not physically adjacent each other, e.g., to provide sampling of behaviors of different regions of the device. In any case, the monitor data may be written to multiple groups of blocks, where a number of write cycles performed for each group is different.

It should be noted that the at least one block may have been written to a plurality of times prior to writing the monitor data. For example, the same data may be rewritten consecutively, different data may be written on each rewrite, a combination of the two, etc. Thus, the monitor data that is ultimately stored on the device may not necessarily be the monitor data that was used during each cycle of writing.

After a period of time, the monitor data is read. See operation 104. The period of time may include any length of time after a point where the monitor data is written (e.g. seconds, minutes, hours, days, etc.). In one embodiment, this period of time may include a user or system defined period of time. As an option, the period of time may be configurable. In any approach, an output of a run time clock, real time clock, calendar, etc. may be used to measure the data age, periods of time, etc. Use of a real time clock is advantageous in that the data age may be readily determined in spite of periods of being powered off, power loss, etc.

Once the monitor data is read, a retention behavior of the at least one block is determined based on the reading. See operation 106. In the case that the monitor data is known to the host system, the determining of the retention behavior may include comparing the read monitor data to a stored version thereof.

Furthermore, the reading of the monitor data and the determining of the retention behavior of the at least one block may occur at periodic intervals. In this case, the periodic intervals may include intervals defined by a user or defined automatically by a system.

Once the retention behavior is determined, a result of the determining is output. See operation 108. In one embodiment, an operational limit of the flash memory device, or portion thereof, may be determined based on the result of the determining of the retention behavior of the at least one block. As an option, writes may no longer be allowed to the flash memory device or a portion thereof when the operation limit is met.

Preferably, the monitor data is write protected by any manner known in the art, e.g., by omitting it from a mapping of available data space. It should be noted that, in one embodiment, at least a portion of the at least one block having the monitor data may be write protected. For example, at least a portion of the at least one block having the monitor data may be write protected to prevent being overwritten with user data.

In one approach, the write protection may be accomplished by marking the blocks as unwritable in a memory controller. In another approach, an indication of a protected block, or portion thereof, may be stored on the flash memory device. Furthermore, in one embodiment, the monitor data may include less than about 1% of a memory capacity of the flash memory device, and more preferably less than about 0.5%. In other embodiments, less than 0.1% of the memory capacity may be used for storing the monitor data.

Using the method 100, flash wearout and retention may be measured by the addition of monitor data to the flash memory device. The monitor data may include data patterns where all values are known to a host system. Thus, errors may be characterized according to number, location, and pattern.

A set of blocks may be positioned at high cycle counts, prior to any user data achieving these cycle counts. A sample of the error rate surface may be made using this data. Once positioned at high cycle count, the monitor data may be checked at intervals to measure the retention behavior. As an option, the measured wearout and data retention limits may be reported via self-monitoring, analysis, and reporting technology (S.M.A.R.T.).

As noted above, NAND flash devices may suffer from finite endurance for erase/write cycles and finite data retention. This is a consequence of the poor reversibility of the data storage process, which drives charge through an insulator. As a result, the bit error rate in flash may be characterized as a 3-D surface.

Figure 2:
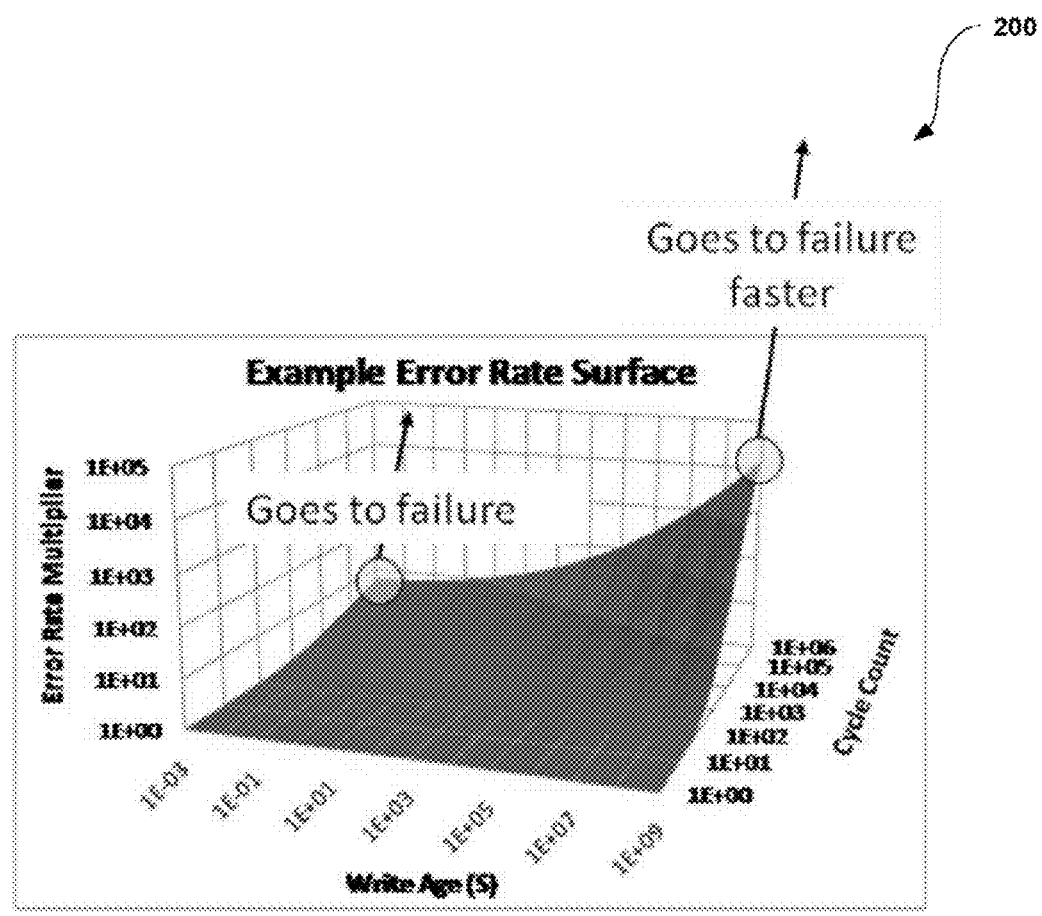
FIG. 2 illustrates a representative plot showing a shape of a flash error rate surface, in accordance with one embodiment.

FIG. 2 illustrates a representative plot 200 showing a shape of a flash error rate surface, in accordance with one embodiment. As shown, the X-axis shows the data age in seconds, from 1 millisecond to 10 years. The depth axis shows the write cycle count, from 1 to $1 \times 10^6$ cycles. The vertical axis is the error rate multiplier. The error rate surface of most flash devices has the general characteristics as shown in FIG. 2.

If cells are written to a sufficiently high cycle count, they tail completely (e.g. an error rate of ½). Thus, the error rate at the left rear corner of the surface illustrated in FIG. 2 increases to failure at some cycle count. Further, the failure occurs at lower cycle counts when the age of the data increases. Thus, the error rate at the right rear corner goes to failure even faster. Designing an ECC, or ECC plus a cyclic redundancy check (CRC) depends on knowing the error rate or the shape of the surface.

Many NAND devices have a number of issues that may impact data integrity. These may include charge detrapping, stress-induced leakage current (SILC), read disturb and write disturb, and/or other issues.

The manufacturing tests for flash (e.g. JEDEC, JESD47F, etc.) are inadequate for IT data integrity. The SILC test uses only 38 devices per lot for 500 hours. Zero errors in such a test indicate an escape rate as high as 6%, to 90% confidence. Further, a 500 hour test allows testing a maximum of 10% of the device to the endurance limit (assuming the rest of the device is not tested at all), but at a data age of only 100 nS.

The data integrity requirements for IT systems may be very strict. Returning corrupt data is generally not acceptable. A loose target of one event per 10 M unit-years may be set. At a 10 kIOPS rate, this gives an uncorrected error rate of $1 \times 10^{-23}$ per bit transferred for a typical 4 kB IO. Thus, designing IT flash systems using the stated endurance specifications may entail significant risk.

Wear leveling may be utilized to increase the time until there are no free blocks below the endurance cycle count. Free blocks may be achieved through spares, or even by moving the static data, for example. One goal of a static wear leveling algorithm is to maximize the cycle count until there are no free or freeable blocks below the endurance limit.

An ideal static wear level algorithm would produce the narrowest distribution at any point in time. This would give the maximum total cycle count for the device. In this case, however, wear leveling assumes the existence of a robust technique for determining that a block has worn out. That is, wear leveling assumes that a cumulative distribution function (CDF) for wearout has an onset that is sudden, and at a known cycle count. Additionally, it is assumed that all blocks have the same wearout characteristics. Further, the effects of retention are ignored.

Figure 3:
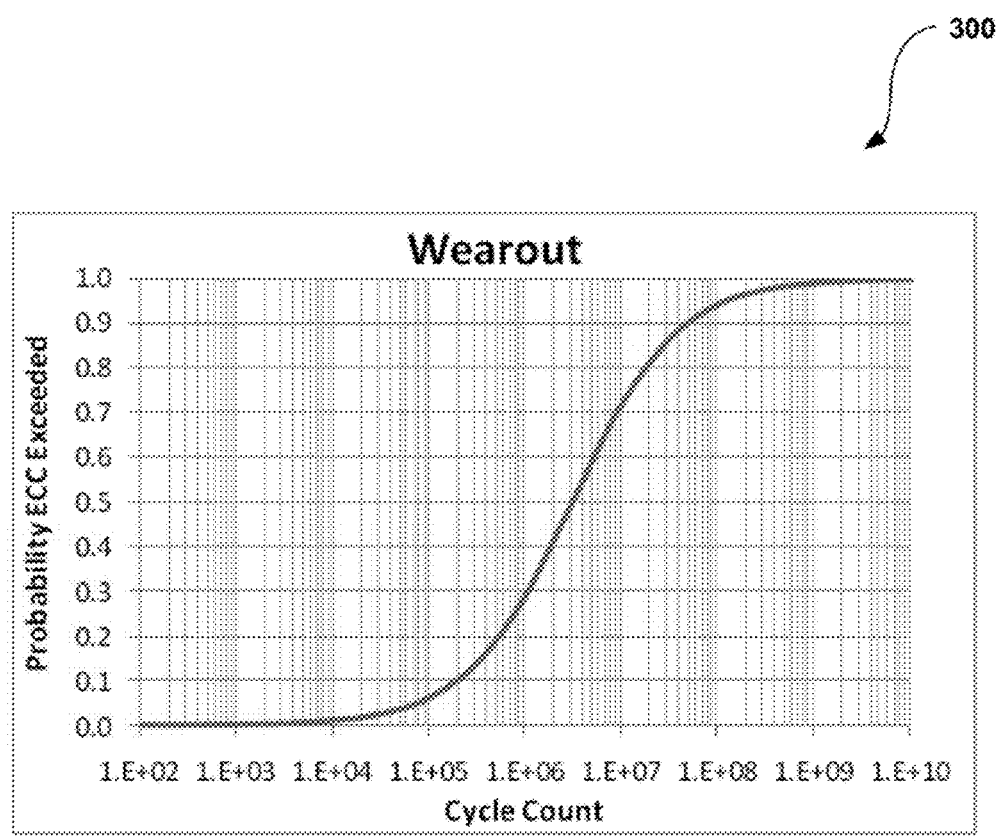
FIG. 3 shows an exemplary cumulative distribution function (CDF) illustrating the probability that a given block will exceed the correction power of a sector-level error correcting code (ECC) due to wearout at some data age, in accordance with one embodiment.

FIG. 3 shows an exemplary CDF 300 illustrating the probability that a given block will exceed the correction power of a sector-level ECC due to wearout at some data age, in accordance with one embodiment. Sector level ECC may be utilized in flash to protect against soft errors and other effects. However, there is a finite limit to the power of the ECC, and this may be exceeded at some point due to block wearout. When this happens, corrupt data may be returned. Additional sector checks, such as a CRC, move the point at which this happens, but may not eliminate this issue.

The curve in FIG. 3 is representative of what the actual field behavior may be at a short data age, in accordance with one embodiment. Assuming a device with an endurance specification of $10^5$ cycles, this may be assigned to a 6% probability, given the JEDEC test results. In this example, it was assumed that 94% of the blocks fail at $10^8$ cycles. At longer data ages, the curve would to shift to the left.

Figure 4:
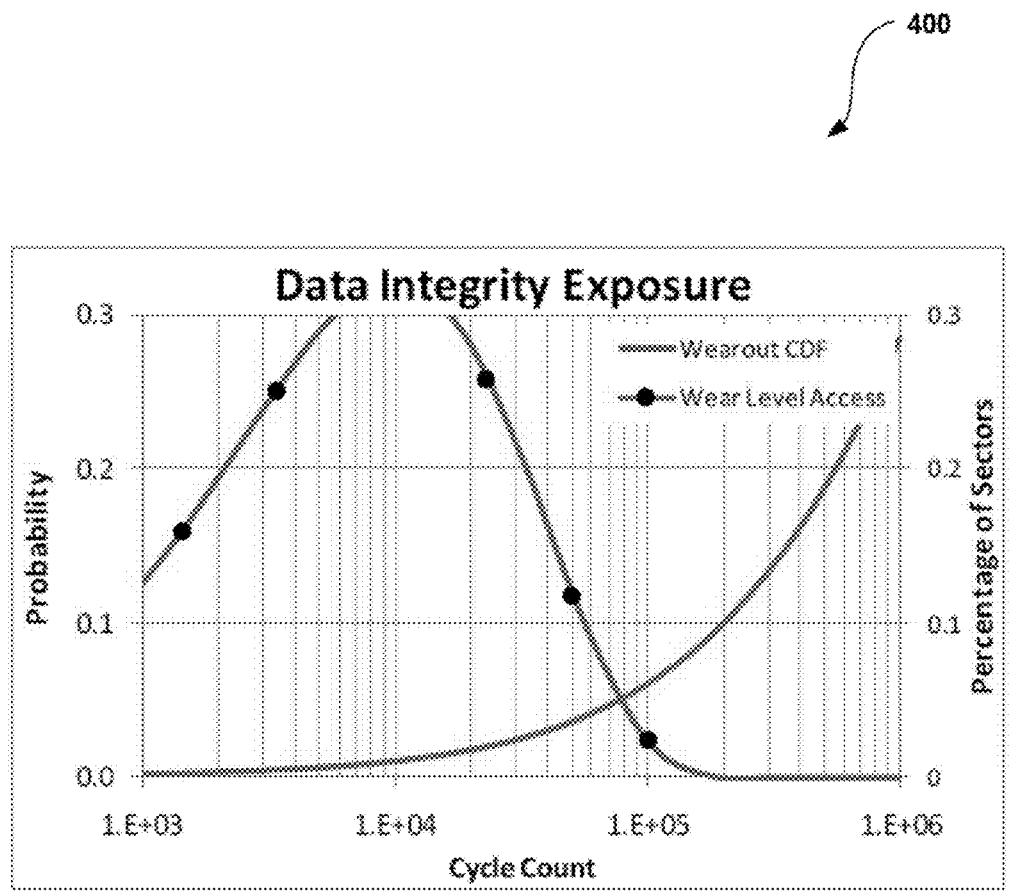
FIG. 4 illustrates a representation of the overlap between the access distribution and the CDF at some data age, in accordance with one embodiment.

The reliability impact may be seen in FIG. 4. FIG. 4 illustrates a representation 400 of the overlap between the access distribution and the CDF at some data age, showing the region of concern, in accordance with one embodiment.

Using FIG. 4, the overlap between the access distribution and the CDF may be seen. The narrower the access distribution, the more likely a large percentage of blocks are in the wearout zone before the wearout is noticed. Thus, it is more likely that a power of the sector ECC will be exceeded and corrupt data will be returned.

To address these and other issues, the error rate surface may be sampled to aid in the determination of the endurance and retention limits for a flash device. In one embodiment, this may be achieved by reserving a number of physical blocks that are not subject to wear leveling. These blocks may include data that is known to a host system such that the values may be fully verified, avoiding any aliasing problems inherent in using error rates determined from ECC.

Further, such blocks may be used at an error rate beyond the ECC capabilities without compromising data integrity. The monitor data may also be verified at intervals to measure the error rate versus retention.

In one embodiment, a set of full erase blocks that are positioned near the expected rise of the CDF may be utilized to aid in determining wearout before it leads to data corruption. For example, a flash device may have 16,000 erase blocks. Using 15 blocks as monitor data would take less than 0.1% of the device capacity.

As an option, 15 blocks arranged in 5 groups of 3 may be utilized. Each group may have the same cycle count. In this case, having multiple blocks in a group may improve the quality of the measurement. The locations (in terms of cycle count) for each group may be chosen to be near the region where the CDF is expected to begin to have a magnitude that may impact data integrity.

As an example, Table 1 shows characteristics representative of flash device, in accordance with one embodiment.

TABLE 1

| Capacity | 8 GB | Page Write | 800 us |
| Page | 4 kB | Block Erase | 1500 us |
| Erase block | 128 pages | Page Read | 60 us |
| Blocks | 16,384 | Block Read | 21 ms |
| Endurance | $10^5$ | Block Write | 116 ms |

In this example, the time to erase/write/read a block is 138 mS. Thus, a monitor data target layout of 5 monitor groups may be chosen. Table 2 shows a representation of a monitor data target layout of 5 monitor groups, in accordance with one embodiment.

TABLE 2

| | Target Cycles (K) | | | | | |
|---|---|---|---|---|---|---|
| | 20 | 36 | 63 | 112 | 200 | Total |
| Time to Deploy (H) | 2.3 | 4.1 | 7.3 | 12.9 | 23.0 | 50 |

In this case, the cycle counts are chosen to be power-law distributed assuming that wearout has a log-normal behavior. In various embodiments, other distributions may be chosen to maximize the effectiveness of the monitor data. In this example, it would take a total of 50 hours to cycle all the monitor data to the final counts.

Figure 5:
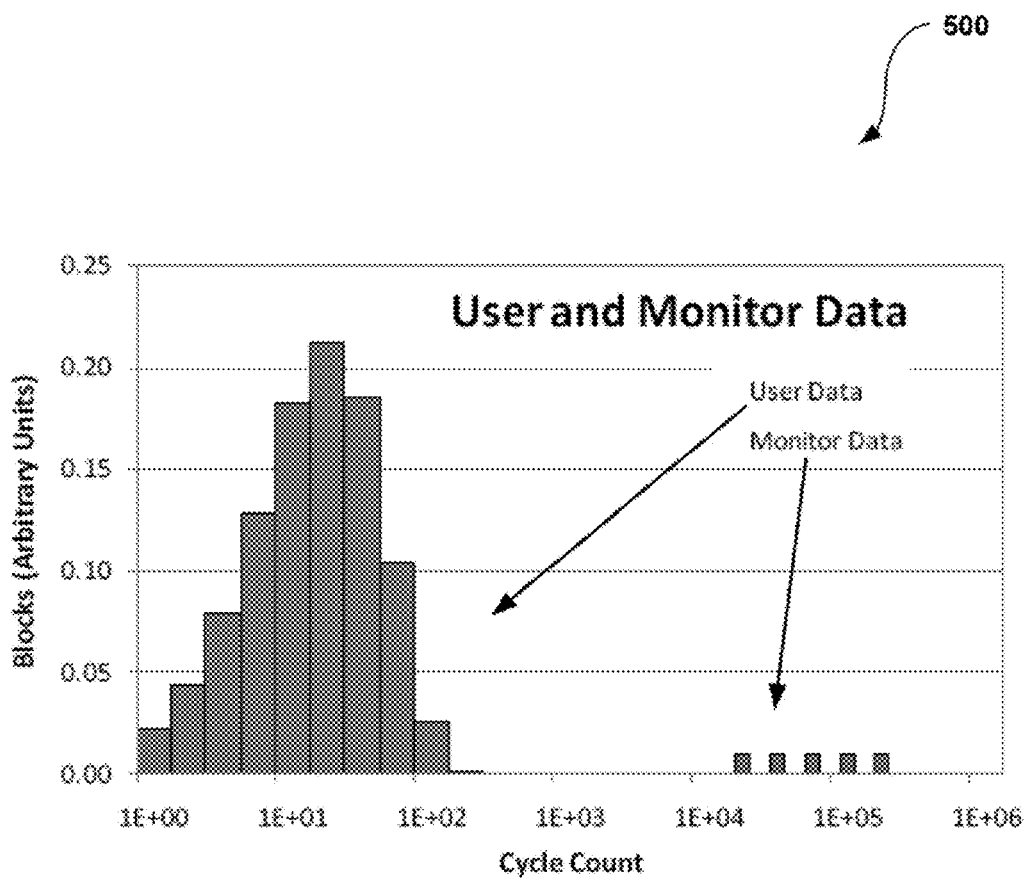
FIG. 5 shows representative cycle count histograms for a user and monitor data at some point in time, in accordance with one embodiment.

FIG. 5 shows representative cycle count histograms 500 for a user and monitor data at some point in time, in accordance with one embodiment. In this case, the histograms of user data and monitor data are shown as function of write cycle count. Furthermore, the data includes wear leveling.

As shown, the monitor data is positioned near the anticipated wearout cycle count. In some cases, the time required to cycle all the monitor data blocks may be longer than desirable to perform prior to shipment. In such a case, the monitor data may be partially cycled prior to shipment, with the remainder of the cycling occurring in the field.

Once the monitor data is at the final cycle count, the blocks may be read at intervals and the read data may be compared with the known data. This allows complete identification of errors, including the ability to maintain a rate of change.

Figure 6:
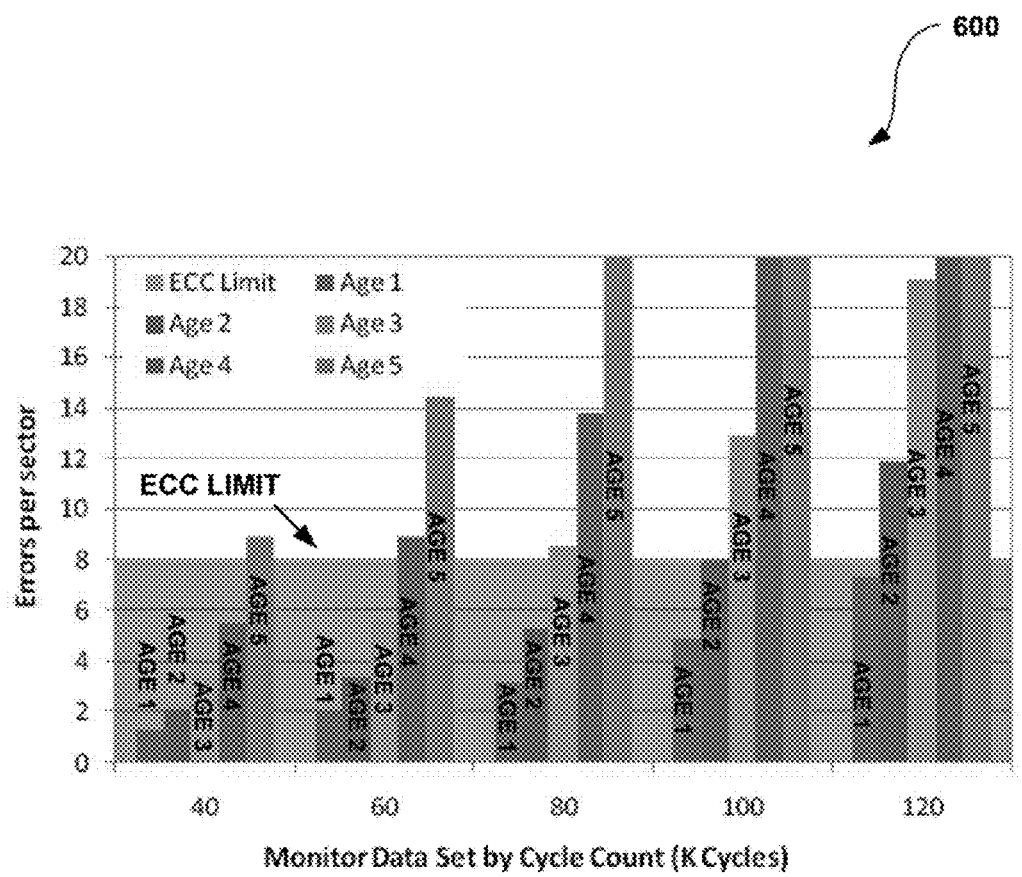
FIG. 6 shows one possible set of measurements from a monitor data system.

FIG. 6 shows one possible set of measurements 600 from a monitor data system. Each monitor group is shown as a column group and each in the group represents a different data age. The height of each column is the number of errors per sector and the lower region labeled "ECC Limit" represents a possible ECC correction limit. As shown, some measurements may exceed the ECC capability and thus pose a risk for data integrity.

In one embodiment, operational limits may be derived from this data. For example, Table 3 shows operational limits that me be generated for the exemplary data in FIG. 6, in accordance with one embodiment.

TABLE 3

| Minimum Cycle Count | Maximum Cycle Count | Maximum Data Age |
|---|---|---|
| <40k | | 4 |
| 40k | 60k | 3 |
| 60k | 80k | 2 |
| 80k | 100k | 2 |
| 100k | 120k | 1 |
| >120k | | Not allowed |

A monitoring data pattern may also be chosen. In various embodiments, this may be a static pattern or be computed for a particular block. As an option, a pattern that stresses the endurance and/or retention may be utilized. In either case, a system may be configured such that the expected contents of each monitor block may be known without reading anything from the flash device. When one of the limits is reached, the system may be informed by a S.M.A.R.T. flag, or another technique such as no longer accepting writes (e.g. returning error on write, etc.).

While much of the above description has described the monitor data units as including entire flash blocks, the techniques discussed are not limited to using entire flash blocks. For example, in one embodiment, the monitor data units may be as small as a sector size.

Although, using sector size monitor data units will retain the monitoring characteristics, in some cases, this may leave exposure to hard errors. For example, if a page size monitor is utilized with user data in the rest of the block, the user data may be marked as lost (i.e. a hard error) if the monitor page exhibited an error rate close to the ECC limits. This is because the sector ECC may not be reliable in such situations. Using this technique, however, the probability of corruption events would still be reduced at a lower overhead.

It should be noted that the invention can take the form of an entirely hardware embodiment, an entirely software embodiment or an embodiment containing both hardware and software elements. For example, in one embodiment, a system may include a flash memory device having a plurality of memory blocks, where at least one of the blocks has monitor data written therein, and the at least one block has been written to a plurality of times prior to writing the monitor data. The system may also include circuitry for addressing the blocks and a secondary memory storing a copy of the monitor data. Additionally, the system may include a storage controller and a plurality of flash memory devices.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 7:
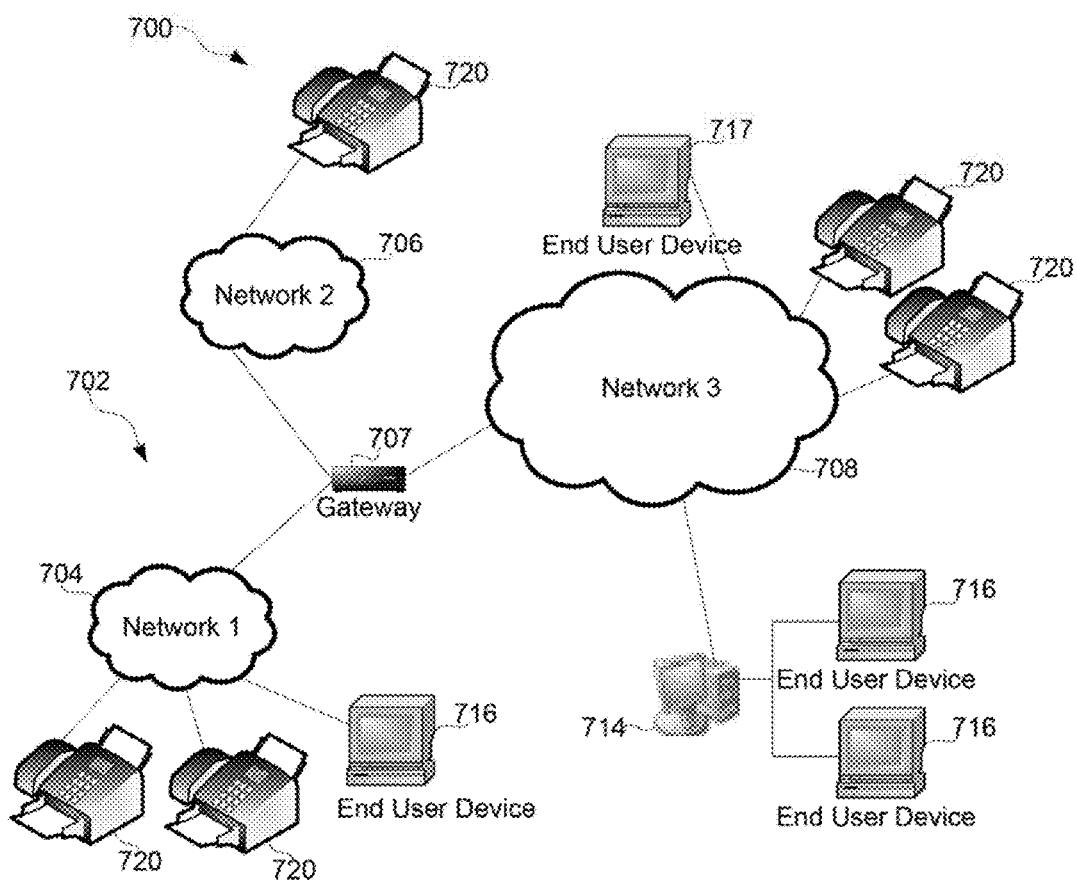
FIG. 7 illustrates a network architecture, in accordance with one embodiment.

FIG. 7 illustrates a network architecture 700, in accordance with one embodiment. As an option, the functionality and architecture of FIGS. 1-6 may be implemented in the context of the network architecture 700. However, the functionality and architecture of FIGS. 1-6 may be carried out in any desired environment. It should be noted that the aforementioned definitions may apply during the present description.

As shown in FIG. 7, a plurality of remote networks 702 are provided including a first remote network 704 and a second remote network 706. A gateway 707 may be coupled between the remote networks 702 and a proximate network 708. In the context of the present network architecture 700, the networks 704, 706 may each take any form including, but not limited to a LAN, a WAN such as the Internet, PSTN, internal telephone network, etc.

In use, the gateway 707 serves as art entrance point from the remote networks 702 to the proximate network 708. As such, the gateway 707 may function as a router, which is capable of directing a given packet of data that arrives at the gateway 707, and a switch, which furnishes the actual path in and out of the gateway 707 for a given packet.

Further included is at least one data server 714 coupled to the proximate network 708, and which is accessible from the remote networks 702 via the gateway 707. It should be noted that the data server(s) 714 may include any type of computing device/groupware. Coupled to each data server 714 is a plurality of user devices 716. Such user devices 716 may include a desktop computer, lap-top computer, hand-held computer, printer or any other type of logic. It should be noted that a user device 717 may also be directly coupled to any of the networks, in one embodiment.

A facsimile machine 720 or series of facsimile machines 720 may be coupled to one or more of the networks 704, 706, 708. It should be noted that databases and/or additional components may be utilized with, or integrated into, any type of network element coupled to the networks 704, 706, 708. In the context of the present description, a network element may refer to any component of a network.

Figure 8:
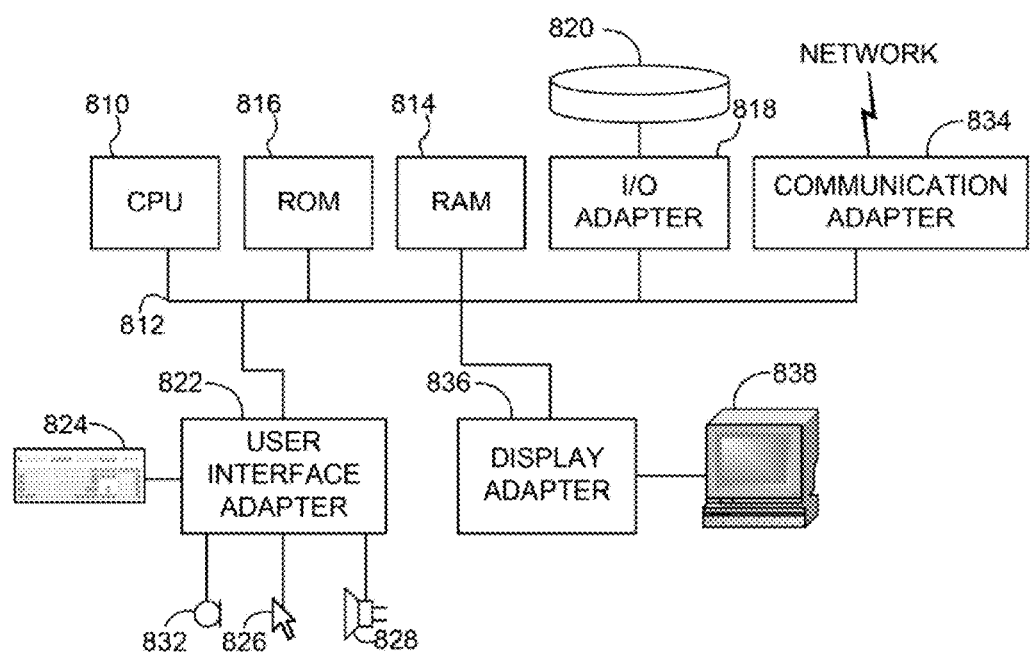
FIG. 8 shows a representative hardware environment that may be associated with the servers and/or clients of FIG. 7, in accordance with one embodiment.

FIG. 8 shows a representative hardware environment associated with a user device 716 of FIG. 7, in accordance with one embodiment. Such figure illustrates a typical hardware configuration of a workstation having a central processing unit 810, such as a microprocessor, and a number of other units interconnected via a system bus 812.

The workstation shown in FIG. 8 includes a Random Access Memory (RAM) 814, Read Only Memory (ROM) 816, an I/O adapter 818 for connecting peripheral devices such as disk storage units 820 to the bus 812, a user interface adapter 822 for connecting a keyboard 824, a mouse 826, a speaker 828, a microphone 832, and/or other user interface devices such as a touch screen and a digital camera (not shown) to the bus 812, communication adapter 834 for connecting the workstation to a communication network 835 (e.g., a data processing network) and a display adapter 836 for connecting the bus 812 to a display device 838.

The workstation may have resident thereon an operating system such as the Microsoft Windows® Operating System (OS), a MAC OS, or UNIX operating system. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A memory device, comprising:
 a plurality of memory blocks having finite endurance and/or retention, at least one of the blocks having monitor data written therein; and
 circuitry for addressing the blocks,
 wherein the monitor data is written to multiple groups of blocks, and
 wherein a number of write cycles performed for each group is different.

2. A method, comprising:
 writing monitor data to at least one block of a memory device as recited in claim 1;
 reading the monitor data after a period of time;
 determining a retention behavior of the at least one block based on the reading; and
 outputting a result of the determining,
 wherein the monitor data is written to multiple groups of blocks, and
 wherein a number of write cycles performed for each group is different.

3. The system of claim 2, wherein the monitor data is: (i) data of known content stored in dedicated memory cells of known write cycle count, (ii) not subject to wear leveling, and (iii) write protected for preventing the monitor data from being overwritten with user data.

4. The method of claim 2, further comprising selecting multiple blocks of the memory device for storing the monitor data, at least two of the blocks not being physically adjacent each other.

5. The method of claim 2, wherein the at least one block has been written to a plurality of times prior to writing the monitor data, wherein at least one of the blocks having monitor data written therein is has a write cycle count near an expected rise of a cumulative distribution function (CDF) for wearout.

6. The method of claim 2, with the proviso that the monitor data is not subject to wear leveling, wherein user data is subject to wear leveling.

7. The method of claim 2, wherein at least a portion of the at least one block having the monitor data is write protected.

8. The method of claim 2, wherein the monitor data is known to a host system, wherein the determining the retention behavior includes comparing the read monitor data to a version thereof stored on the host system.

9. The method of claim 2, wherein determining the retention behavior includes measuring a retention and endurance of the at least one block.

10. The method of claim 2, wherein the monitor data comprises less than about 1% of a memory capacity of the memory device.

11. The method of claim 2, further comprising performing the reading and determining at periodic intervals.

12. The method of claim 2, further comprising determining an operational limit of the memory device or portion thereof based on the result of the determining.

13. The method of claim 12, further comprising no longer allowing writes to the memory device or portion thereof when the operation limit is met.

14. The memory device of claim 1, wherein at least two of the blocks have the monitor data written therein and are not physically adjacent each other.

15. The memory device of claim 1, wherein at least a portion of the at least one block having the monitor data is write protected.

16. The memory device of claim 15, wherein wherein at least two of the blocks have the monitor data written therein and are not physically adjacent each other, with the proviso that the monitor data is not subject to wear leveling, wherein writing of user data to the memory blocks is subject to wear leveling.

17. The memory device of claim 1, wherein the monitor data comprises less than about 1% of a memory capacity of the memory device.

18. The memory device of claim 1, with the proviso that the monitor data is not subject to wear leveling.

19. The memory device of claim 1, wherein the at least one block has been written to a plurality of times prior to writing the monitor data, wherein at least one of the blocks having monitor data written therein is has a write cycle count near an expected rise of a cumulative distribution function (CDF) for wearout.

20. A computer program product, comprising:
 a non-transitory computer usable medium having computer usable program code embodied therewith, the computer usable program code comprising:
 computer usable program code configured to write monitor data to at least one block of a memory device, the memory device comprising:
  a plurality of memory blocks having finite endurance and/or retention, at least one of the blocks having monitor data written therein, and
  circuitry for addressing the blocks,
  wherein the monitor data is written to multiple groups of blocks, and
  wherein a number of write cycles performed for each group is different;
 computer usable program code configured to read the monitor data after a period of time;
 computer usable program code configured to determine a retention behavior of the at least one block based on the reading;
 computer usable program code configured to output a result of the determining;
 computer usable program code configured to provide wear leveling when writing user data to the memory blocks, with the proviso that the monitor data is not subject to wear leveling.

21. A system, comprising:
- a memory device having finite endurance and/or retention, the memory device comprising:
  - a plurality of memory blocks, at least one of the blocks having monitor data written therein, wherein the at least one block has been written to a plurality of times prior to writing the monitor data; and
  - circuitry for addressing the blocks,
  - with the proviso that the monitor data is not subject to wear leveling,
  - a module for subjecting writing of user data to wear leveling.

22. The system of claim 21, wherein the monitor data is: (i) data of known content stored in dedicated memory cells of known write cycle count, (ii) not subject to wear leveling, and (iii) write protected for preventing the monitor data from being overwritten with user data.

23. The system of claim 21, further comprising a non-transitory computer usable medium, the computer usable medium having computer usable program code embodied therewith, which when executed by a processor causes the processor to:
- write the monitor data to the at least one block of a memory device having finite endurance and/or retention;
- read the monitor data after a period of time;
- determine a retention behavior of the at least one block based on the reading; and
- output a result of the determining.

24. The system of claim 21, further comprising a storage controller and a plurality of the memory devices.

25. The system of claim 21, wherein at least two of the blocks have the memory data written therein and are not physically adjacent each other.

* * * * *